US012628291B2

(12) United States Patent
Jargans et al.

(10) Patent No.: US 12,628,291 B2
(45) Date of Patent: May 12, 2026

(54) COMPONENT FOR HIGH-VOLTAGE SYSTEM OF A VEHICLE

(71) Applicant: VOLVO TRUCK CORPORATION, Gothenburg (SE)

(72) Inventors: Ringolds Jargans, Trollhättan (SE); Diego Santos Pereira Netto, Askim (SE)

(73) Assignee: VOLVO TRUCK CORPORATION, Gothenburg (SE)

( * ) Notice: Subject to any disclaimer, the term of this patent is extended or adjusted under 35 U.S.C. 154(b) by 160 days.

(21) Appl. No.: 18/524,671

(22) Filed: Nov. 30, 2023

(65) Prior Publication Data

US 2024/0206090 A1 Jun. 20, 2024

(30) Foreign Application Priority Data

Dec. 19, 2022 (EP) .................................... 22214535

(51) Int. Cl.

| | |
|---|---|
| *H05K 5/02* | (2006.01) |
| *B60R 16/023* | (2006.01) |
| *H01R 13/631* | (2006.01) |
| *H01R 24/58* | (2011.01) |
| *H01R 103/00* | (2006.01) |

(52) U.S. Cl.
CPC ......... *H05K 5/0217* (2013.01); *B60R 16/023* (2013.01); *H01R 13/631* (2013.01); *H01R 24/58* (2013.01); *H05K 5/0247* (2013.01); *H01R 2103/00* (2013.01); *H01R 2201/26* (2013.01)

(58) Field of Classification Search
CPC ........ B60R 16/023; B60R 16/03; H01H 9/08; H01R 13/631; H01R 2103/00; H01R 2201/26; H01R 24/58; H01R 31/08; H05K 5/0217; H05K 5/0247
See application file for complete search history.

(56) References Cited

U.S. PATENT DOCUMENTS

| | | | |
|---|---|---|---|
| 2,444,198 | A | 6/1948 | Hasselhorn |
| 2022/0200214 | A1 | 6/2022 | Roemelsberger et al. |

FOREIGN PATENT DOCUMENTS

| | | | |
|---|---|---|---|
| CN | 203434113 U | * | 2/2014 |
| CN | 204992139 U | * | 1/2016 |

(Continued)

OTHER PUBLICATIONS

Extended European Search Report in corresponding European Application No. 22214535.1 dated Jun. 5, 2023 (8 pages).

*Primary Examiner* — Kenneth Bukowski
(74) *Attorney, Agent, or Firm* — Jeffri A. Kaminski; Venable LLP

(57) ABSTRACT

A component for a high-voltage electric system of a vehicle includes a body having a circular cross section; an electrical device encapsulated within the body; a first electrically conductive contact area arranged circumferentially on the body and configured to form a first electrical connection to the electrical device; a second electrically conductive contact area arranged circumferentially on the body and configured to form a second electrical connection to the electric device, the second electrically conductive contact area being separated from the first electrically conductive contact area in the axial direction of the body; a cap attached to an end portion of the body; and a fastening mechanism configured to secure the component in a socket.

20 Claims, 6 Drawing Sheets

(56) References Cited

FOREIGN PATENT DOCUMENTS

| | | | | | |
|---|---|---|---|---|---|
| CN | 106373823 | A | * | 2/2017 | |
| CN | 118053714 | A | * | 5/2024 | ........... H01H 85/055 |
| DE | 102013013368 | A1 | * | 2/2015 | ............. H01R 4/183 |
| DE | 102013014178 | A1 | * | 2/2015 | ........... H01R 13/447 |
| DE | 102017009124 | A1 | * | 7/2018 | ........... H01H 85/202 |
| DE | 202020100457 | U1 | * | 2/2020 | ......... H01H 85/0208 |
| WO | 21181404 | A1 | | 9/2021 | |

* cited by examiner

400

401

401          120

114          115

116

102          106

402

403          110

410

406   120

114          115

116

102          106

110

404

600

100

COMPONENT FOR HIGH-VOLTAGE SYSTEM OF A VEHICLE

TECHNICAL FIELD

The disclosure relates generally to a component for a high-voltage system in a vehicle. In particular aspects, the disclosure relates to a component comprising an electrical device arranged within the component. The disclosure can be applied in heavy-duty vehicles having a high-voltage system, such as trucks, buses, and construction equipment. Although the disclosure may be described with respect to a particular vehicle, the disclosure is not restricted to any particular vehicle.

BACKGROUND

With the increasing use of electric and hybrid propulsion systems in heavy vehicle, it also becomes increasingly important to provide high-voltage systems which are reliable and easily serviceable. In particular, components which are subjected to wear, and which may require replacement are advantageously easily replaceable in the vehicle. Preferably, it should be possible to remove and replace components in a high-voltage system such as contactors, fuses and pre-charge components within a matter of minutes and without having to take the vehicle to a workshop. Accordingly, it is desirable to provide improved components for high-voltage systems which facilitate fast and easy replacement.

SUMMARY

According to a first aspect of the disclosure, it is provided a component for a high-voltage electric system of a vehicle, the component comprising: a body having a circular cross section; an electrical device encapsulated within the body; a first electrically conductive contact area arranged circumferentially on the body and configured to form a first electrical connection to the electrical device; a second electrically conductive contact area arranged circumferentially on the body and configured to form a second electrical connection to the electric device, the second contact area being separated from the first contact area in the axial direction of the body; a cap attached to an end portion of the body; and a fastening mechanism configured to secure the component in a socket.

The first aspect of the disclosure seeks to provide an improved high-voltage component for a vehicle which is both safe as well as fast and easy to replace when needed. A technical benefit may include that the described component provides a plug-n-play functionality where the component is ready to be used as soon as it is installed and that the component can easily be accessed from an outside of the high-voltage electric system. A further advantage of the described component is that no alignment is required which significantly reduces the risk of a faulty installation. It is also possible to configure the component so that it can be installed and removed without using tools.

In some examples, the body has a substantially cylindrical shape. The body thus has a circular cross-section which has substantially the same diameter over the length of the component, with the exception of the cap which may have a larger diameter. A technical benefit may include that the component is easy to install and that the component does not require alignment when being installed. Moreover, a cylindrical shape enables the use of many commonly used fastening mechanisms.

In some examples, the body is tapered in a direction away from the cap. The body thus has a circular cross-section which has a decreasing diameter over the length of the component in a direction away from the cap. A technical benefit may include that the component may more easily fit into a correspondingly conical socket.

In some examples, the electrical device is a contactor, a fuse or a pre-charge resistor. A technical benefit may include that since the aforementioned devices are subject to wear during use of the vehicle, it is advantageous that they are easy to replace. The devices may thus be enclosed within the component.

In some examples, the first contact area and the second contact area are configured to form a first high-voltage terminal connected to a corresponding first terminal of the electric device, and a second high-voltage terminal connected to a corresponding second terminal of the electric device. Each of the first and second contact area can thereby act as a respective high-voltage terminal to connect a two-terminal device to a high voltage system of the vehicle. Then number of high voltage terminals can be increased if required by the device or if multiple devices are arranged in the same component.

In some examples, at least one of the first and second contact area is threaded and configured to be threaded into a receiving socket, thereby forming a fastening mechanism or part of a fastening mechanism of the component. A technical benefit may include that a good electrical and mechanical connection can be ensured by the threaded contact areas when the component is installed in a socket. Moreover, the threaded connection may be sufficient so that no further fastening mechanism is required, thereby simplifying the design of the component.

In some examples, the component further comprises third and fourth contact areas each arranged circumferentially on the body. The third and fourth contact areas may for example be low-voltage terminals for controlling functionality of the component. A technical benefit may include additional functionality can be included in the component.

In some examples, the cap of the component comprises a seal ring configured to form a seal against a socket. A technical benefit may include that a closed seal is formed between the component and a socket so that the contact areas are fully protected from the external environment, thereby reducing the risk of corrosion and other types of degradation of the contacts. The components may preferably be located so that they are easily accessible from an outside of the vehicle which in turn may expose the components to water, dirt and the like, making a secure seal advantageous to protect the contact areas.

In some examples, the fastening mechanism comprises a bayonet coupling, a threaded coupling, a snap coupling, or a push-lock coupling. A technical benefit may include that secure and easy fastening of the component in a socket can be achieved. The specific fastening mechanism to use can be selected based on requirements of a component in a particular implementation, where different fastening mechanisms may provide different advantages. The fastening mechanism can also be selected based on the ease of manufacturing.

In some examples, an outer portion of the cap comprises a protruding element configured to be engaged by a tool or by hand. An outer portion of the cap may also comprise a recess configured to be engaged by a tool. A technical benefit may include ease of access and installation.

In some examples, a diameter of the body is stepwise decreasing in a direction away from the cap. The body can thus be seen as a tapered cylinder. A technical benefit may include that secure installation is further facilitated since the component can be guided into a correspondingly tapered socket and a close fit can be ensured.

In some examples, there is also provided a connector assembly comprising a component according to any one of the aforementioned examples and a socket configured to receive the component. The shape and configuration of the socket would then have electrically conductive contact areas corresponding to the contact areas of the component. Moreover, the socket is connected to and forms part of the high-voltage system of the vehicle so that the component is ready to be used as soon as it is installed in the socket.

In some examples, the socket comprises a first electrical spring contact arranged to form a contact with the first contact area and a second electrical spring contact arranged to form a contact with the second contact area. A technical benefit may include that the component can be inserted and guided into the correct position and that a good electrical contact can be ensured by the spring contacts.

In some examples, the socket comprises a receiving mechanism configured to engage the fastening mechanism of the component such that the component is secured in the socket.

In some examples, the socket comprises a seal configured to form a seal against the cap of the connector. A technical benefit may include that if a seal is arranged in the connector, this may be sufficient for ensuring a closed seal against the environment. This in turn has the advantageous effect that there is no need for seal in the component which may reduce the complexity and the manufacturing cost of the component. However, it would also be possible to provide a seal in both the connector as well as in the socket. The seal may for example comprise one or more rubber gaskets or similar sealing mechanisms known to the skilled person.

In some examples, there is also provided a vehicle comprising a connector assembly according to any one the aforementioned examples.

The above aspects, accompanying claims, and/or examples disclosed herein above and later below may be suitably combined with each other as would be apparent to anyone of ordinary skill in the art.

Additional features and advantages are disclosed in the following description, claims, and drawings, and in part will be readily apparent therefrom to those skilled in the art or recognized by practicing the disclosure as described herein. There are also disclosed herein control units, computer readable media, and computer program products associated with the above discussed technical benefits.

BRIEF DESCRIPTION OF THE DRAWINGS

With reference to the appended drawings, below follows a more detailed description of aspects of the disclosure cited as examples.

DETAILED DESCRIPTION

Aspects set forth below represent the necessary information to enable those skilled in the art to practice the disclosure.

Present solutions for replaceable components in high voltage systems for example include a removable service box which encapsulates previously stated components together with several additional components in one removable package. This drives significant cost and design complexity due to additional components required to secure ease of service while maintaining degree of safety and system integrity. Moreover, such solutions may also fail to meet increased serviceability requirements where it is desirable that certain components should be replaceable without having to visit a workshop or the like.

Figure 1:
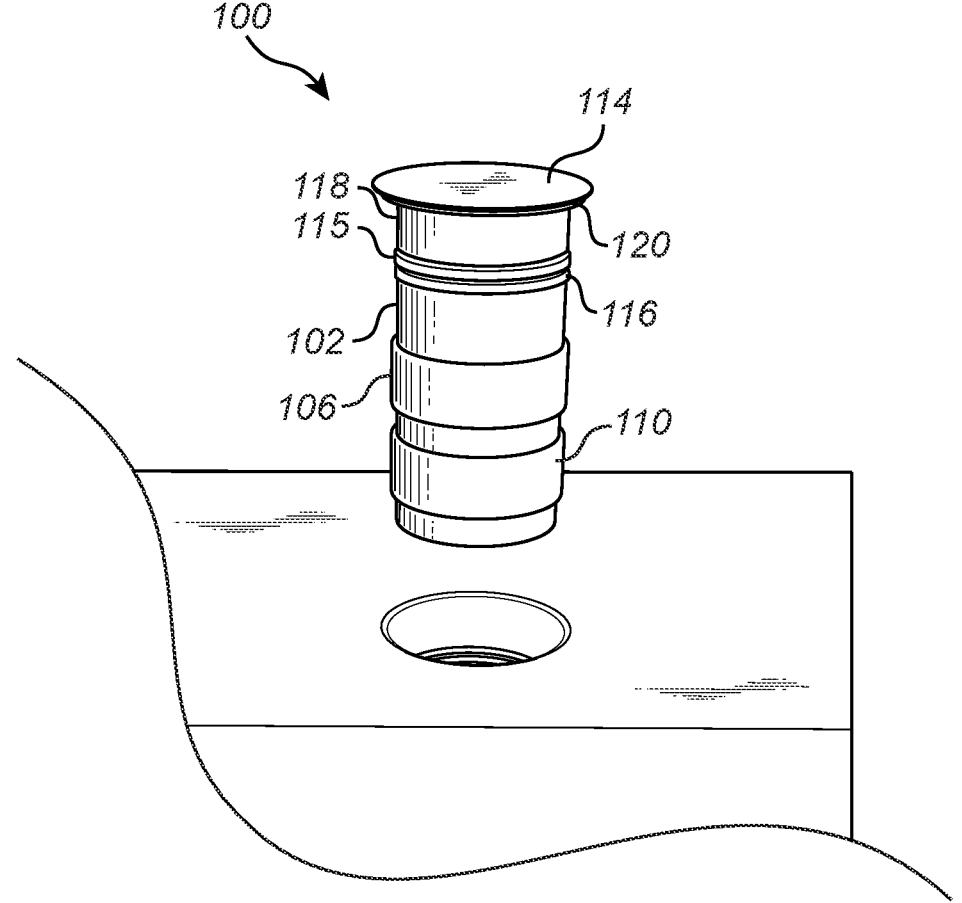
FIG. 1 is a schematic illustration of an exemplary component according to one example of the inventive concept.
Figure 2:
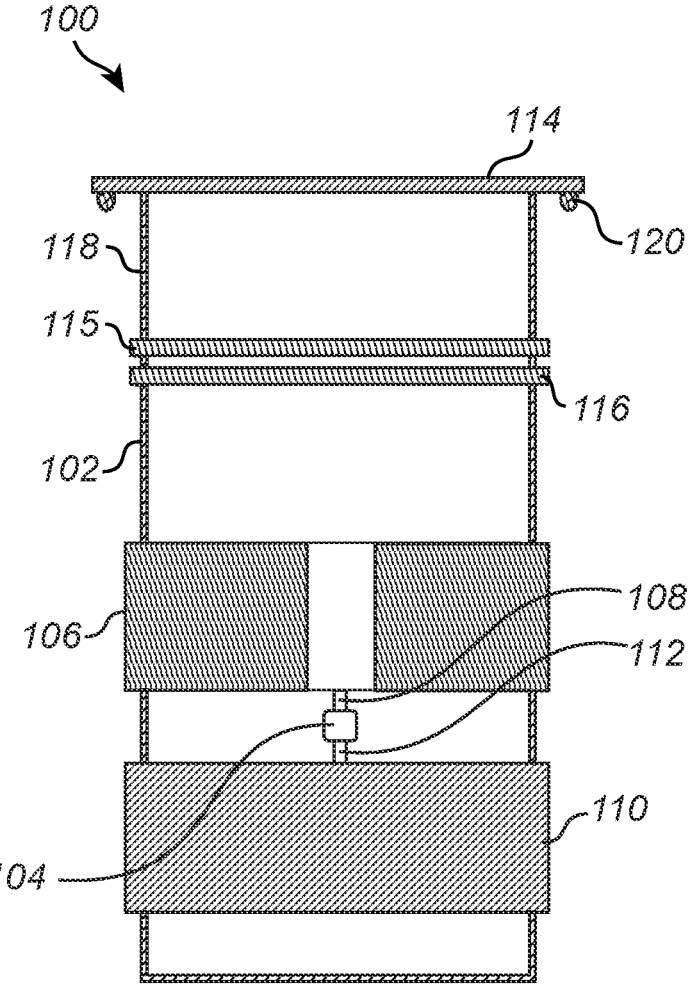
FIG. 2 is a schematic cross section view of an exemplary component according to one example of the inventive concept.

FIG. 1 is an exemplary component 100 for a high-voltage electric system of a vehicle and FIG. 2 is a cross section view of the component 100. The component comprises a body 102 having a circular cross section. The body 102 is substantially cylindrical and the body 102 is made from an electrically insulating material. The component 100 further comprises an electrical device 104 encapsulated within the body, where the electrical device 104 preferably is hermetically sealed within the body 102. The body 102 may also be gas filled, for example by an inert gas, in part to protect the electrical device 104 and also to reduce the risk of arcing or the like inside the component 100. The electrical device 104 may be a contactor, a fuse or a pre-charge resistor which are devices which are subjected to wear in a high-voltage system, and which thereby need replacement. However, it would also be possible to arrange other devices within the described component.

The component further comprises a first electrically conductive contact area 106 arranged circumferentially on the body 102 and configured to form a first electrical connection 108 to the electrical device 104 and a second electrically conductive contact area 110 arranged circumferentially on the body 102 and configured to form a second electrical connection 112 to the electric device 104, where the second contact area 110 is separated from the first contact area in the axial direction of the body. Both the width and the separation distance of the first and second contact areas 106, 110 can be selected to ensure that there is no arcing or currents between the first and second contact areas 106, 110 and can thereby be based on the properties of a particular high-voltage electric system. The described first and second contact areas 106, 110 can also be referred to as first and second contacts 106, 110. Moreover, the first contact area 106 and the second contact area 110 are configured to form a first high-voltage terminal 106 connected to a corresponding first terminal 108 of the electric device, and a second high-voltage terminal 110 connected to a corresponding second terminal 112 of the electrical device 104.

In the present description, the first and second contact areas 106, 110 are illustrated to reach all the way around the component 100 to form a circular contact area. However, the first and second contact areas 106, 110 may equally well be sectioned and/or divided into separate area portions along the circumference of the component 100 while still providing the same technical effects and benefits as contacts reaching all the way around the component.

The first and second contact areas 106, 110 may for example be formed by metal rings, such as copper rings, to provide good electrical conductivity. Moreover, the first and second contact areas 106, 110 are arranged to reach through the body 102 to form an electrical connection from the outside of the component 100 to the internally arranged electrical device 104.

The component 100 further comprises a cap 114 attached to an end portion 118 of the body 102 and a fastening mechanism configured to secure the component in a socket. FIGS. 1 and 2 do not illustrate any specific fastening mechanism since many different options are feasible. The fastening mechanism may also be at least partially arranged in the receiving socket. Moreover, the parts of the component 100 such as the contacts 106, 110 and/or the cap 114 can also be configured to be part of the fastening mechanism.

The cap 114 is here represented by a circular plate at the end portion 118 of the body 102 and the cap 114 is further illustrated to comprise a seal 120 in the form of a rubber gasket or the like configured to form an environmental seal when the component 100 is arranged in a corresponding socket. In general, the seal 120 may comprise an O-ring or a washer. It should however be noted that both the end cap 114 and the seal 120 may be configured in many different ways while still providing the desired functionality.

In some examples, the component 100 further comprises third and fourth contact areas 115, 116 each arranged circumferentially on the body. The third and fourth contact areas 115, 116 are for example low-voltage terminals and the third and fourth contact areas 115, 116 can consequently be made smaller as illustrated in FIGS. 1-2 since they do not have to carry the same amount of current as the high-voltage contacts 106, 110. The low-voltage terminals 115, 116 may for example provide gnd and vcc terminals for control signals of the electrical device 104. The third and fourth contact areas 115, 116 are thereby electrically connected to the device within the component. In the present context, a low voltage is typically in the range below 48V, such nominal voltage values 3.3 V, 5 V, 12 V, 24 V to be used for control signals. High-voltage in the present context refers to voltages above 48 V, and in a high-voltage electric system of a vehicle the high voltage may be the so called traction voltage with voltages in range between 500 V and 900 V. The skilled person readily realizes that the number of terminals for both high-voltage and low-voltage connections can be increased or decreased depending on the required functionality for a particular application.

Figure 3:
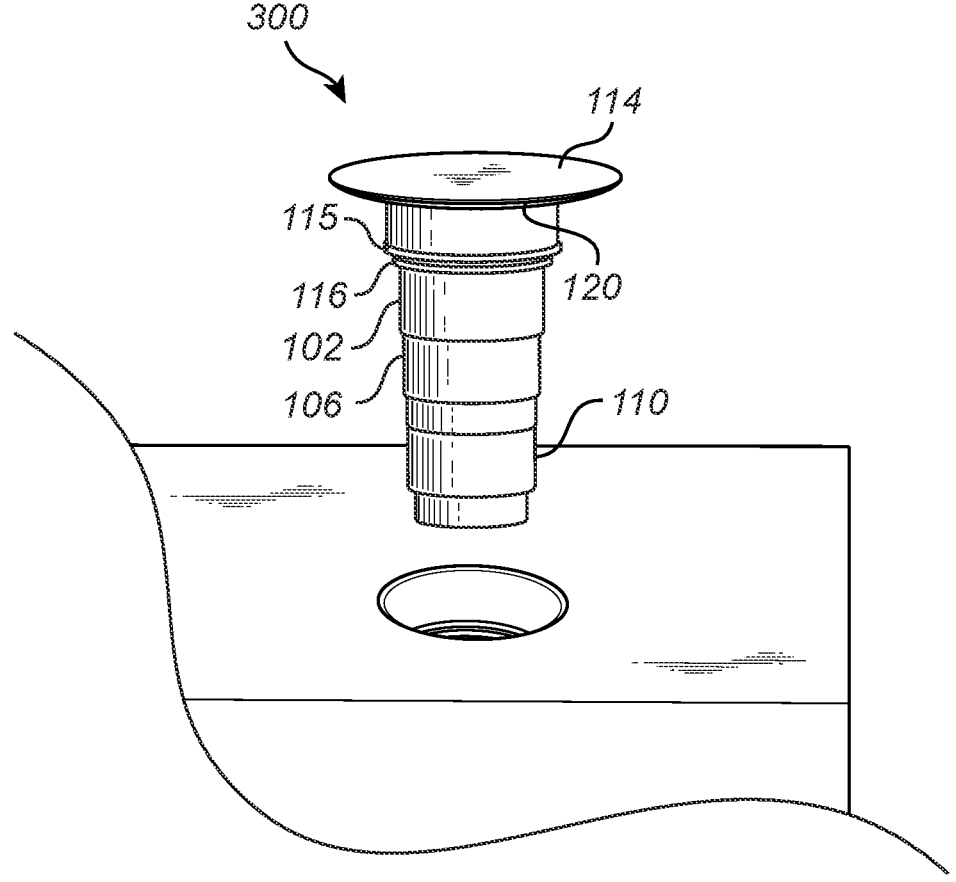
FIG. 3 is a schematic illustration of an exemplary component according to one example of the inventive concept.

FIG. 3 schematically illustrate a component 300 where a diameter of the body 102 is stepwise decreasing in a direction away from the cap 114. The component 300 will thus have a tapered or conical shape with the largest diameter closest to the cap 114. Moreover, in the illustrated example the diameter of the first electrically conductive contact area 106 is larger than a diameter of the second electrically conductive contact area 110.

Figure 4A:
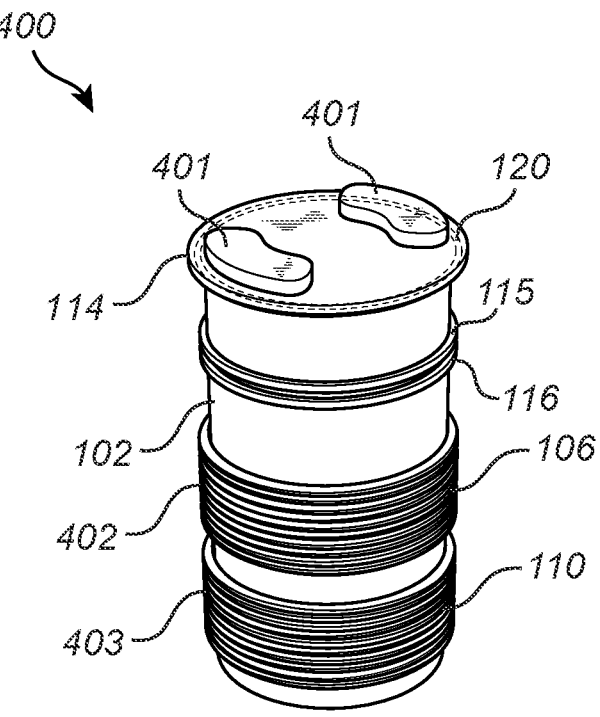
FIGS. 4A and 4B are a schematic illustrations of an exemplary component according to one example of the inventive concept.
Figure 4B:
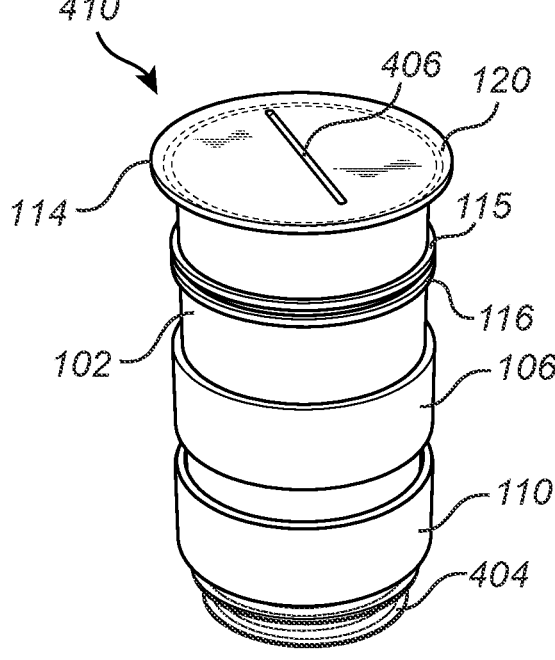

FIGS. 4A-B schematically illustrate examples of components 400, 410 having a threaded fastening mechanism 403, 404. In the component 400 of FIG. 4A the first and second contact areas 106, 110 are threaded which ensures both that a good electrical connection can be formed between the component 400 and a socket and that the component 400 can be securely mechanically connected to a socket. In the component 410 of FIG. 4B, an end portion 404 of the body 102 located in the end opposite the cap 114 is threaded to secure the component 410 in a socket. FIGS. 4A-B thus illustrate two possible examples of fastening mechanisms, but many different fastening mechanisms can be used, including but not limited to bayonet coupling, other types of twist-lock mechanisms, push-lock mechanisms, snap-in mechanisms etc. Moreover, the fastening mechanism can be located at either end of the component, and it is also possible to provide fastening mechanisms at both ends of the component.

FIGS. 4A-B also illustrate features for facilitating installation and removal of the components 400, 410 where in FIG. 4A an outer portion of the cap 114 of the component 400 comprises protruding elements 401 which may be configured to be engaged by a tool or by hand. In FIG. 4B, an outer portion of the cap 114 of the component 410 comprises a recess 406 configured to be engaged by a tool. The protruding elements 401 and/or the recess 406 may also be configured to require special tools for removal to avoid accidental removal of the components 400, 410. In some implementations, case of removal may be prioritized in which case the cap 114 can be configured to enable removal by hand or by using commonly available tools.

Figure 5:
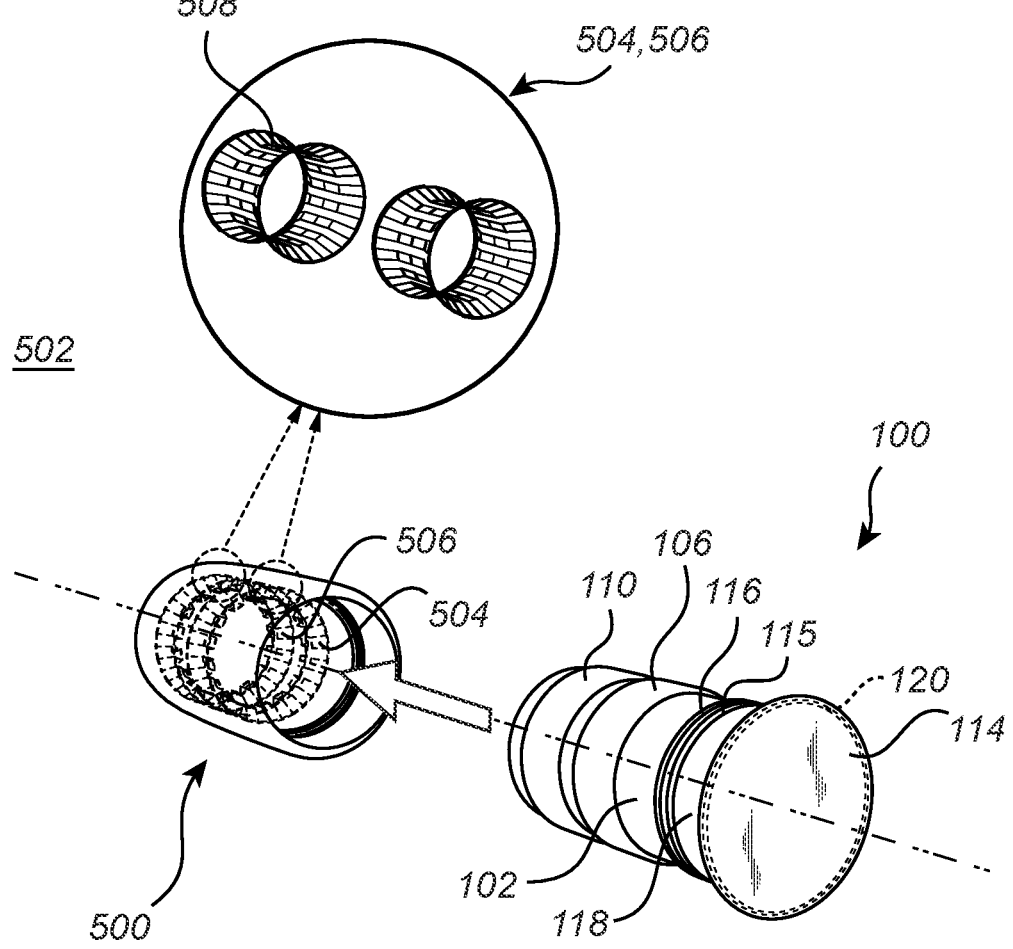
FIG. 5 is a schematic illustration of an exemplary connector assembly according to one example of the inventive concept.

FIG. 5 schematically illustrate a socket 500 configured to receive a component 100. The socket 500 and component together form a connector assembly 502. In the illustrated example, the socket comprises a first electrical spring contact 504 arranged to form a contact with the first contact area 106 and a second electrical spring contact 506 arranged to form a contact with the second contact area 110. The first and second electrical spring contacts 504, 506 are configured to have an inner diameter which is smaller than an outer diameter of a respective contact 106, 110 such that the central portion 508 of the spring contact 504, 506 press against the respective contact area 106, 110 when the component 100 is inserted into the socket, thereby forming an electrical connection.

The socket 500 may advantageously also be configured to prevent or at least reduce the risk of insertion of foreign objects into the interior of the system or component in which the socket is arranged when no component is installed in the socket.

Figure 6:
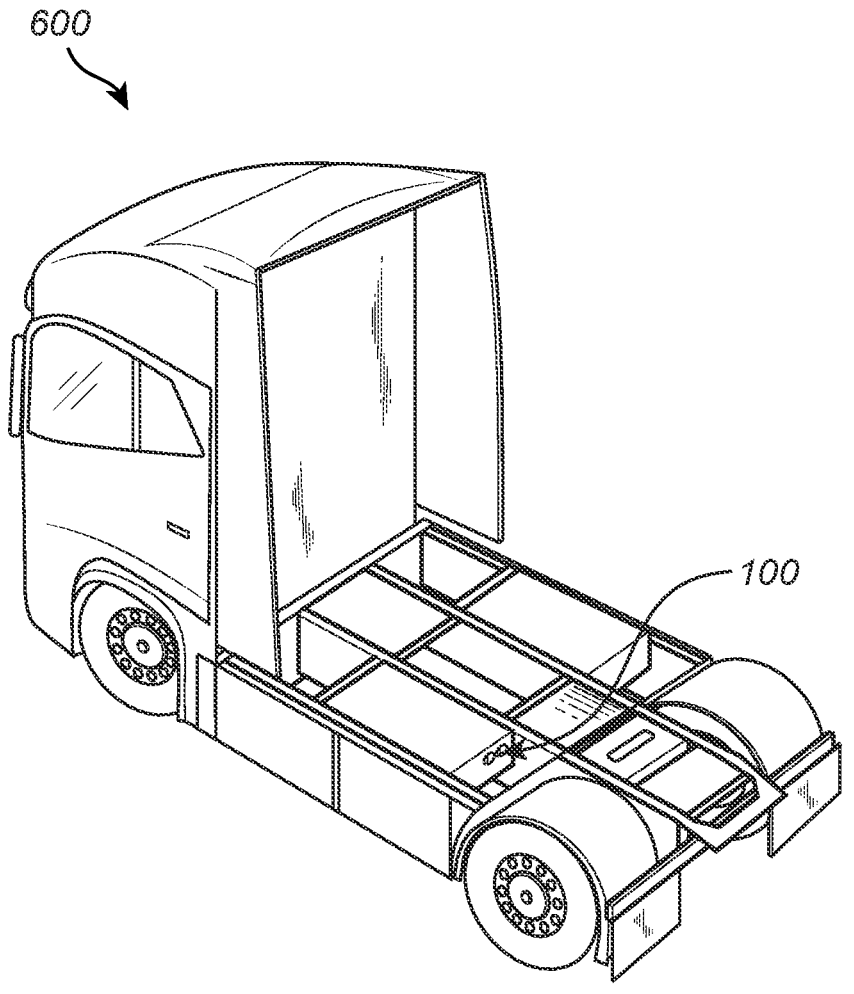
FIG. 6 is a schematic illustration of an exemplary vehicle comprising a component according to one example of the inventive concept.

FIG. 6 is a schematic illustration of an exemplary vehicle 600 comprising a component 100 according to one example of the inventive concept. Here it is illustrated that the component is easily accessible for improved serviceability of the vehicle 600.

Example 1. A component (100) for a high-voltage electric system of a vehicle, the component comprising:

a body (102) having a circular cross section;

an electrical device (104) encapsulated within the body;

a first electrically conductive contact area (106) arranged circumferentially on the body and configured to form a first electrical connection (108) to the electrical device;

a second electrically conductive contact area (110) arranged circumferentially on the body and configured to form a second electrical connection (112) to the electric device, the second electrically conductive contact area being separated from the first electrically conductive contact area in the axial direction of the body;

a cap (114) attached to an end portion (118) of the body; and a fastening mechanism (402, 403, 404) configured to secure the component in a socket.

Example 2. The component according to example 1, wherein the body has a substantially cylindrical shape.

Example 3. The component according to example 1 or 2, wherein the body is tapered in a direction away from the cap.

Example 4. The component according to any one of the preceding examples, wherein the electrical device is a contactor, a fuse or a pre-charge resistor.

Example 5. The component according to any one of the preceding examples, wherein the first contact area and the second contact area are configured to form a first high-voltage terminal connected to a corresponding first terminal of the electric device, and a second high-voltage terminal connected to a corresponding second terminal of the electric device.

Example 6. The component according to any one of the preceding examples, wherein at least one of the first and second contact area is threaded and configured to be threaded into a receiving socket.

Example 7. The component according to any one of the preceding examples, further comprising third and fourth contact areas (115, 116) each arranged circumferentially on the body.

Example 8. The component according to example 7, wherein the third and fourth contact areas are low-voltage terminals.

Example 9. The component according to any one of the preceding examples, wherein the cap comprises a seal (120) configured to form a seal against a socket.

Example 10. The component according to any one of the preceding examples, wherein the fastening mechanism comprises a bayonet coupling, a threaded coupling, a snap coupling, or a push-lock coupling.

Example 11. The component according to any one of the preceding examples, wherein an outer portion of the cap comprises a protruding element (401) configured to be engaged by a tool or by hand.

Example 12. The component according to any one of the preceding examples, wherein an outer portion of the cap comprises a recess (406) configured to be engaged by a tool.

Example 13. The component according to any one of the preceding examples, wherein a diameter of the body is stepwise decreasing in a direction away from the cap.

Example 14. A vehicle comprising a component according to any one of the preceding examples.

Example 15. A socket configured to receive a component according to any one of examples 1 to 13.

Example 16. A connector assembly comprising a component according to any one of examples 1 to 13 and a socket (500) configured to receive the component.

Example 17. The connector assembly according to example 15, wherein the socket comprises a first electrical spring contact arranged to form a contact with the first contact area and a second electrical spring contact arranged to form a contact with the second contact area.

Example 18. The connector assembly according to example 16 or 17, wherein the socket comprises a receiving mechanism configured to engage the fastening mechanism of the component such that the component is secured in the socket.

Example 19. The connector assembly according to example 16 or 17, wherein the socket comprises a seal configured to form a seal against the cap of the connector.

Example 20. A vehicle comprising a connector assembly according to any one of examples 15 to 19.

The terminology used herein is for the purpose of describing particular aspects only and is not intended to be limiting of the disclosure. As used herein, the singular forms "a," "an," and "the" are intended to include the plural forms as well, unless the context clearly indicates otherwise. As used herein, the term "and/or" includes any and all combinations of one or more of the associated listed items. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

It will be understood that, although the terms first, second, etc., may be used herein to describe various elements, these elements should not be limited by these terms. These terms are only used to distinguish one element from another. For example, a first element could be termed a second element, and, similarly, a second element could be termed a first element without departing from the scope of the present disclosure.

Relative terms such as "below" or "above" or "upper" or "lower" or "horizontal" or "vertical" may be used herein to describe a relationship of one element to another element as illustrated in the Figures. It will be understood that these terms and those discussed above are intended to encompass different orientations of the device in addition to the orientation depicted in the Figures. It will be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present.

Unless otherwise defined, all terms (including technical and scientific terms) used herein have the same meaning as commonly understood by one of ordinary skill in the art to which this disclosure belongs. It will be further understood that terms used herein should be interpreted as having a meaning consistent with their meaning in the context of this specification and the relevant art and will not be interpreted in an idealized or overly formal sense unless expressly so defined herein.

It is to be understood that the present disclosure is not limited to the aspects described above and illustrated in the drawings; rather, the skilled person will recognize that many changes and modifications may be made within the scope of the present disclosure and appended claims. In the drawings and specification, there have been disclosed aspects for purposes of illustration only and not for purposes of limitation, the scope of the inventive concepts being set forth in the following claims.

The invention claimed is:

1. A component for a high-voltage electric system of a vehicle, the component comprising:

a body having a circular cross section;

an electrical device encapsulated within the body;

a first electrically conductive contact area arranged circumferentially on the body and configured to form a first electrical connection to the electrical device;

a second electrically conductive contact area arranged circumferentially on the body and configured to form a second electrical connection to the electric device, the second electrically conductive contact area being separated from the first electrically conductive contact area in the axial direction of the body, each of the first and second electrically conductive contact area being located at an axial distance from and separate from a respective end portion of the body;

a cap located at and attached to an end portion of the body; and a fastening mechanism configured to secure the component in a socket.

2. The component according to claim 1, wherein the body has a substantially cylindrical shape.

3. The component according to claim 1, wherein the body is tapered in a direction away from the cap.

4. The component according to claim 1, wherein the electrical device is a contactor, a fuse or a pre-charge resistor.

5. The component according to claim 1, wherein the first contact area and the second contact area are configured to form a first high-voltage terminal connected to a corresponding first terminal of the electric device, and a second high-voltage terminal connected to a corresponding second terminal of the electric device.

6. The component according to claim 1, wherein at least one of the first and second contact area is threaded and configured to be threaded into a receiving socket.

7. The component according to claim 1, further comprising third and fourth contact areas each arranged circumferentially on the body.

8. The component according to claim 7, wherein the third and fourth contact areas are low-voltage terminals.

9. The component according to claim 1, wherein the cap comprises a seal configured to form a seal against a socket.

10. The component according to claim 1, wherein the fastening mechanism comprises a bayonet coupling, a threaded coupling, a snap coupling, or a push-lock coupling.

11. The component according to claim 1, wherein an outer portion of the cap comprises a protruding element configured to be engaged by a tool or by hand.

12. The component according to claim 1, wherein an outer portion of the cap comprises a recess configured to be engaged by a tool.

13. The component according to claim 1, wherein a diameter of the body is stepwise decreasing in a direction away from the cap.

14. A vehicle comprising a component according to claim 1.

15. A socket configured to receive a component according to claim 1.

16. A connector assembly comprising a component according to claim 1 and a socket configured to receive the component.

17. The connector assembly according to claim 15, wherein the socket comprises a first electrical spring contact arranged to form a contact with the first contact area and a second electrical spring contact arranged to form a contact with the second contact area.

18. The connector assembly according to claim 16, wherein the socket comprises a receiving mechanism configured to engage the fastening mechanism of the component such that the component is secured in the socket.

19. The connector assembly according to claim 16, wherein the socket comprises a seal configured to form a seal against the cap of the connector.

20. A vehicle comprising a connector assembly according to claim 15.

* * * * *